United States Patent [19]

Kawakami et al.

[11] Patent Number: 5,294,755
[45] Date of Patent: Mar. 15, 1994

[54] PRINTED WIRING BOARD HAVING SHIELDING LAYER

[75] Inventors: Shin Kawakami; Satoshi Haruyama; Hirotaka Okonogi, all of Saitama, Japan

[73] Assignee: Nippon CMK Corp., Japan

[21] Appl. No.: 772,111

[22] Filed: Oct. 4, 1991

Related U.S. Application Data

[63] Continuation of Ser. No. 494,166, Mar. 15, 1990.

[30] Foreign Application Priority Data

Mar. 15, 1989 [JP] Japan .................................. 1-62688

[51] Int. Cl.$^5$ ............................................. H05U 01/00
[52] U.S. Cl. ........................................ 174/264; 174/36; 174/255; 174/362; 361/808
[58] Field of Search .............. 174/264, 262, 254, 255, 174/36; 361/414, 409, 418

[56] References Cited

U.S. PATENT DOCUMENTS

| | | | |
|---|---|---|---|
| 4,311,749 | 1/1982 | Hiraiwa | 174/254 |
| 4,327,247 | 4/1982 | Mituhashi et al. | 174/264 |
| 4,383,363 | 5/1983 | Hayakawa | 174/264 X |
| 4,801,489 | 1/1989 | Nakagawa | 174/36 X |
| 4,830,691 | 5/1989 | Kida | 29/852 X |

OTHER PUBLICATIONS

McDermott, C. J. *Face Protection of Printed Circuit Boards*, IBM Disclosure, vol. 11, No. 7, December 1968, p. 733.

*Primary Examiner*—Leo P. Picard
*Assistant Examiner*—Cheryl R. Figlin
*Attorney, Agent, or Firm*—Bruce L. Adams; Van C. Wilks

[57] ABSTRACT

A printed wiring board having a shielding layer for use in an integrated circuit is disclosed. The printed wiring board comprises an insulating sheet having a connecting through hole portion, a printed wiring circuit provided on one or both surfaces of the insulating sheet, an insulating layer having a thickness of 20~50 μm which is provided on the printed wiring circuit, and an electromagnetic shielding layer provided on the insulating layer.

16 Claims, 2 Drawing Sheets

PRINTED WIRING BOARD HAVING SHIELDING LAYER

This is a continuation application of parent application Ser. No. 494,166 filed Mar. 15, 1990.

BACKGROUND OF THE INVENTION

The present invention relates to a printed wiring board having a shielding layer.

A printed wiring board having an electromagnetic wave shielding layer provided through an insulating layer is well known from Japanese Patent Laid-open No. 213,192/87. The printed wiring board 9 disclosed in this Japanese Patent Laid-open comprises, as shown in FIG. 3, an insulating sheet 1, printed wiring circuits 2 formed on both surfaces of the insulating sheet 1, an insulating layer 4 provided on a part of the printed wiring circuits 2, an electromagnetic wave shielding layer 5 provided on the insulating layer 4 and a part of the printed wiring circuit 2 and a solder resist layer 6 provided on the shielding layer 5.

In the forming portion of the printed wiring circuit 2 and the shielding layer 5 in the conventional printed wiring board 9 having the shielding layer 5, the insulating layer 4 is formed on the printed wiring circuit 2 by a screen printing process, and as shown in FIG. 3b, on a connecting land 20 to the shielding layer 5 in the printed wiring circuit 2, a relief angle portion 40 having the same diameter as that of the connecting land 20 (for example, 3 mm$\phi$) is provided, and then a grounded circuit 5a is formed on the relief angle portion 40 together with the shielding layer simultaneously.

Between the relief angle portion 40 formed on the connecting land 20 and the insulating layer 4, however, unevenness corresponding to the thickness of the insulating layer 4 formed on the printed wiring circuit 2 is present, so that the thickness of outer periphery portion 5b of the grounded circuit 5a out of the shielding layer 5 formed by the screen printing process becomes thin compared with the thickness of the other shielding layer 5 and thus the shielding ink does not fill in or flow in the relief angle portion 40 smoothly, thereby causing an unevenness of the shielding layer and failing a formation of proper grounded circuit 5a.

At the relief angle portion 40, moreover, the grounded circuit 5a having a thickness more than necessary is formed (for example, if the thickness of shielding layer 5 is about 20 $\mu$m, the grounded circuit 5a having a thickness of about 50 $\mu$m is usually formed at the relief angle portion) while this grounded circuit 5a is commonly formed by the shielding paste, so that the more the thickness of coated film, the less the flexibility, and thus the grounded circuit becomes brittle (for example, a crack is caused in the grounded circuit 5a in the case of thermal expansion and shrinkage under solder dipping.)

SUMMARY OF THE INVENTION

It is an objective of the present invention to eliminate the above disadvantages of the conventional printed wiring board.

It is another objective of the present invention to provide a printed wiring board capable of having a grounded circuit thereof with its thickness equal to that of the rest of the shielding layer.

According to the present invention, there is provided a printed wiring board comprising an insulating sheet having a connecting through hole portion, a printed wiring circuit provided on one or both surfaces of the insulating sheet, an insulating layer provided on the printed wiring circuit, the insulating layer including a cup shaped relief angle portion provided on a connecting land for the printed wiring circuit, and an electromagnetic shielding layer provided on the insulating layer.

According to the printed wiring board of the present invention, a grounded circuit is formed through a shaped portion formed on a connecting land between the printed wiring circuit and the shielding layer, so that unevenness of thickness of the grounded circuit may be prevented and the brittleness of the grounded circuit due to the fact that the thickness of the grounded circuit becomes larger than the other shielding layer may also be prevented, and thus a preferable shielding layer may be formed, thereby obtaining a printed wiring board having a high shielding effect and excellent durability.

In a printed wiring board according to the present invention, the printed wiring circuit is constructed by filling a sealing member of heat-resistant material or weather-resistant material in the connecting through hole portion thereof. In a printed wiring board according to the present invention, the sealing member is a thermosetting synthetic resin or a photosetting synthetic resin. In a printed wiring board according to the present invention, the sealing member is a conductive synthetic resin including carbon, silver, copper or the like, thereby connecting a printed wiring circuit provided on both surfaces of the insulating sheet.

DETAILED EXPLANATION OF THE PREFERRED EMBODIMENT

Now to the drawings, there is shown one embodiment of a printed wiring board according to the present invention.

Figure 1:
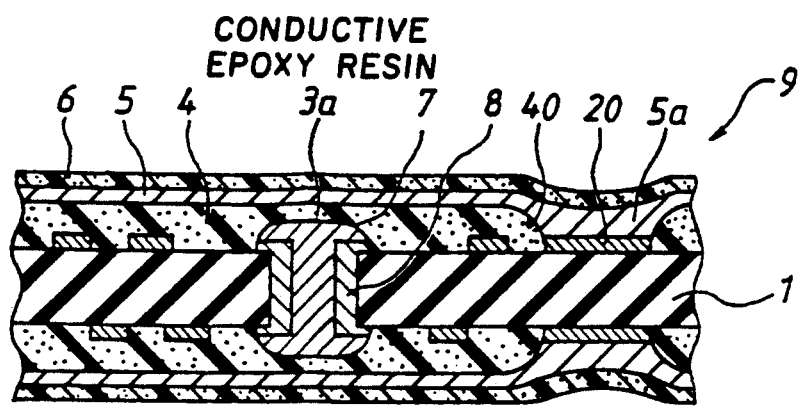
FIGS. 1a, 1b and 1c are enlarged cross-sectional views showing one embodiment of a printed wiring board according to the present invention.
Figure 1:
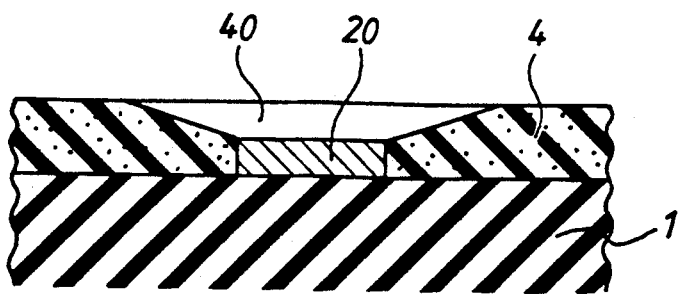
Figure 1:
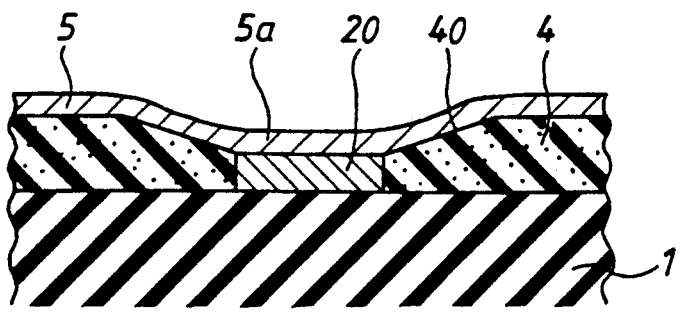
Figure 2:
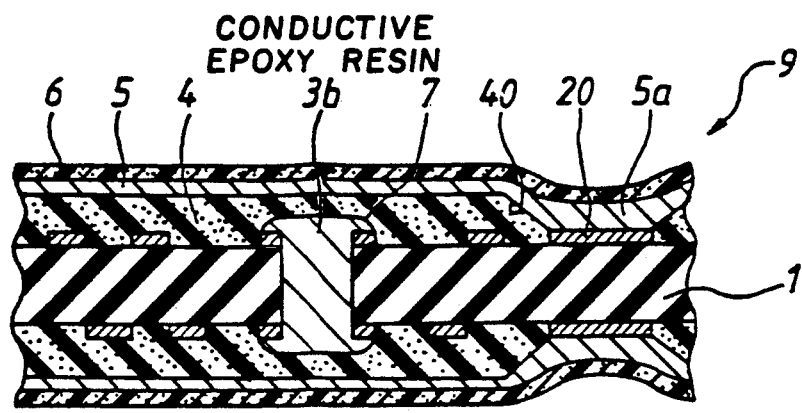
FIG. 2 is an enlarged cross-sectional view showing another embodiment of a printed wiring board according to the present invention.
Figure 3A:
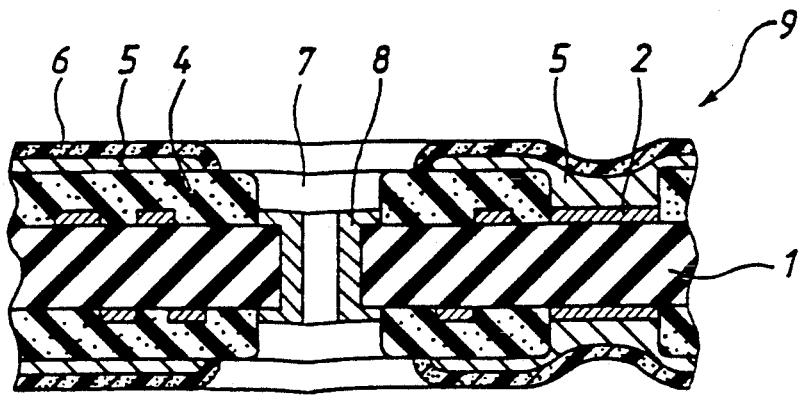
FIGS. 3a and 3b are enlarged cross-sectional views showing conventional printed wiring boards.
Figure 3B:
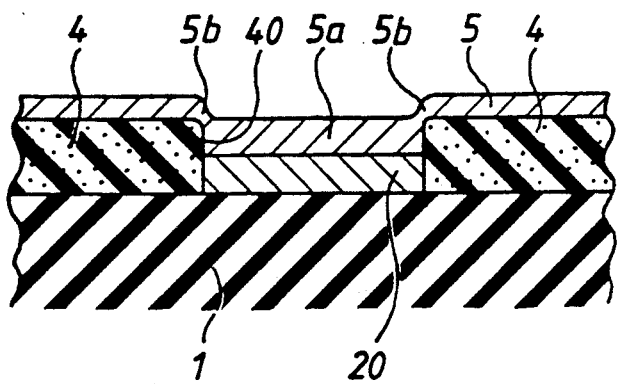

In FIGS. 1, 2 and 3, corresponding components are given the same reference numerals.

FIG. 1 is an enlarged cross-sectional view partially showing one embodiment of a printed wiring board according to the present invention. Reference numeral 1 is an insulating sheet having at its both sides printed wiring circuits 2 of a given pattern which are connected to each other by a plated through hole 8.

Reference numeral 3a is a sealing member filled in a connecting through hole portion 7. The sealing member 3a consists of a heat-resistant material or a weather-resistant material, such as a thermosetting synthetic resin of epoxide (epoxy) resin or the like or a photosetting synthetic resin of acrylic epoxy resin or the like. The sealing member 3a is formed by filling a conductive paste of the above described synthetic resin in respective connecting through hole portions 7 by a screen printing means, and then by hardening the conductive paste.

An insulating layer 4 is provided on a part of the printed wiring circuits 2 and the sealing member 3a by the screen printing means, and an electromagnetic wave shielding layer 5 is provided on the insulating layer 4 and a part of the printed wiring circuit 2, and finally, a solder resist layer 6 is provided on the electromagnetic wave shielding layer 5. The solder resist layer 6 serves also as a protection layer for the shielding layer 5.

The thickness of the insulating layer 4 may preferably be approximately 20~50 μm. Particularly, as shown in FIG. 1b, a cup shaped relief angle portion 40 is formed on a connecting land 20 of the shielding layer 5 and the grounded circuit 5a of the printed circuit board 2.

Through the cup shaped relief angle portion 40, then, the grounded circuit 5a to the connecting land 20 is formed simultaneously with the formation of the shielding layer 5.

As shown in FIG. 1c, therefore, the thickness of the grounded circuit 5a and the shielding layer 5 may be unified by forming the grounded circuit 5a through the cup shaped relief angle portion 40, and the thickness of the outer periphery portion and the inner periphery portion of the connecting land 20 may also be unified by decreasing the differential step with the cup shaped relief angle portion.

The cup shaped relief angle portion 40 is formed by the screen printing process at the formation of the insulating layer 4 and in order to perform such a screen printing process, the screen printing process may be carried out a plurality of times to form a required thickness of the insulating layer 4, instead of forming the required thickness of the insulating layer 4 by running the screen printing process only one time.

Particularly, on forming the relief angle portion 40 on the connecting land 20 and during formation of the insulating layer 4 by a plurality of times of screen printing processes, at first, the relief angle portion 40 having the same diameter as that of the connecting land 20 is formed by first a screen printing process with a portion 40 having a first diameter, after this, the cup shaped relief angle portions 40 each having diameters larger than the previous first diameter of the connecting lands 20 may be formed stepwise by consecutive screen printing processes.

For example, if the thickness of the insulating layer 4 is 45 μm, the relief angle portion having a thickness of 15 μm by formed by running one screen printing process 3 times. If the connecting land 20 has a diameter of 3 mm, for example, the relief angle portion 40 has the thickness of 3 mm the first time, and the relief angle portion 40 has the thickness 3.1 mm the second time and thus the relief angle portion 40 has the thickness of 3.2 mm the third time, so that the cup shaped relief angle portion 40 may be formed by the insulating layer 4 on the connecting land 20.

When the connecting land 20 and the grounded circuit 5a are formed through such a cup shaped relief angle portion 40, the relief angle portion 40 has a smooth slant surface in the direction from its outer periphery portion to its inner periphery portion, so that the shielding paste for shielding layer 5 may be applied on and along the slant surface during a screen printing process and thus the thickness of the grounded circuit 5a and the shielding layer 5 may be unified.

FIG. 2 is a partial enlarged cross-sectional view showing another embodiment of a printed wiring board according to the present invention.

In this embodiment, the printed wiring board 9 comprises a sealing member 3b consisting of a conductive synthetic resin material which includes carbon, silver, copper or the like, so that the printed wiring circuits 2 provided on both sides of the insulating sheet 1 may be connected by the conductive sealing member 3b and thus the connecting through hole portion 7 need not be subjected to a plating process. That is, the plated through hole 8 may be omitted.

The other construction of the printed wiring board 9 is the same as that of the printed wiring board 9 shown in FIG. 1, so that its detailed explanation is omitted.

In the above construction, the provision of the insulating layer 4, the electromagnetic wave shielding layer 5 and the solder resist layer 6 is performed by well known manufacturing steps, so that its concrete explanation may be omitted.

According to the printed wiring board of the present invention, in the double-sided printed wiring board or multilayer printed wiring board, the sealing member of heat-resistant material or weather-resistant material is filled in the connecting through hole portion, and the electromagnetic wave shielding layer is provided on the connecting through hole and the printed wiring circuits with the interposition of the insulating layer (without a grounded wiring circuit), so that affection of electromagnetic wave of passive noise or active noise on the printed wiring board can be prevented even at the connecting through hole portion.

Moreover, the electromagnetic wave shielding layer is not divided at the connecting through hole portion, thereby obtaining a large effective area of the shielding layer, so that the printed wiring board with very sufficient electromagnetic wave shielding effect can be obtained.

It is further understood by those skilled in the art that the foregoing description is a preferred embodiment of the disclosed device and that various changes and modification may be made in the invention without departing from the spirit and scope thereof.

What is claimed is:

1. A printed wiring board comprising: an insulating sheet having a connecting through hole portion, a printed wiring circuit provided on at least one surface of the insulating sheet and having at least one connecting land having an upper peripheral edge portion spaced from the insulating sheet, an insulating layer provided on the printed wiring circuit, the insulating layer forming a cup-shaped relief angle portion with the upper peripheral edge portion of the at least one connecting land, and an electromagnetic shielding layer provided on the insulating layer and on the at least one connecting land.

2. A printed wiring board as claimed in claim 1, further comprising a sealing member composed of heat-resistant material filling the connecting through hole portion.

3. A printed wiring board as claimed in claim 2, wherein the sealing member comprises a thermosetting synthetic resin.

4. A printed wiring board as claimed in claim 2, including a printed wiring circuit on top and bottom surfaces of the insulating sheet, and wherein the sealing member comprises a conductive synthetic resin to connect the printed wiring circuits on both the top and bottom surfaces of the insulating sheeting at least one 5. A printed circuit board comprising: an insulating substrate; a printed circuit on at least one surface of the substrate and having at least one connecting land having an upper peripheral edge portion spaced from the substrate and an upper surface bounded by the upper peripheral edge portion; an insulating layer disposed on and covering the printed circuit, the insulating layer having a thickness greater than that of the at least one connecting land and extending downwardly to the upper peripheral edge portion of the at least one connecting land to define a cup-shaped relief angle; and an electromagnetic shielding layer on the insulating layer and on the upper surface of the at least one connecting land.

6. A printed circuit board according to claim 5, further comprising a hole therein, and a sealing member filling the hole.

7. A printed circuit board according to claim 6, wherein the sealing member comprises a thermosetting synthetic resin.

8. A circuit board according to claim 7, further comprising a printed circuit on both surfaces of the substrate, and wherein the sealing member comprises conductive synthetic resin for connecting the printed circuits.

9. A printed wiring board as claimed in claim 1, further comprising a sealing member composed of weather-resistant material filling the connecting through hole portion.

10. A printed wiring board as claimed in claim 2, wherein the sealing member comprises a photosetting synthetic resin.

11. A printed wiring board according to claim 6, wherein the sealing member comprises a photosetting synthetic resin.

12. A printed wiring board according to claim 1, wherein the electromagnetic shielding layer provided on the insulating layer and on the at least one connecting land completely covers the at least one connecting land.

13. A printed circuit board according to claim 5, wherein the electromagnetic shielding layer completely covers the upper surface of the at least one connecting land.

14. A printed circuit board according to claim 5, wherein the downwardly extending portion of the insulating layer contacts the upper peripheral edge portion of the at least one connecting land and extends downwardly along the peripheral side thereof to the insulating substrate.

15. A printed circuit board according to claim 14, wherein the insulating layer extends downwardly along the peripheral side of the at least one connecting land and does not contact the upper surface thereof.

16. A printed circuit board according to claim 5, wherein the insulating layer extends downwardly along the peripheral side of the at least one connecting land and does not contact the upper surface thereof.

* * * * *